US005800879A

United States Patent [19]
Moran et al.

[11] Patent Number: 5,800,879
[45] Date of Patent: Sep. 1, 1998

[54] DEPOSITION OF HIGH QUALITY DIAMOND FILM ON REFRACTORY NITRIDE

[76] Inventors: Mark B. Moran; Linda F. Johnson, both of 1124 Yosemite La.; Karl A. Klemm, 1145 W. Langley Ave., all of Ridgecrest, Calif. 93555

[21] Appl. No.: 702,208

[22] Filed: May 16, 1991

[51] Int. Cl.$^6$ ............... B05D 3/06; C23C 16/26
[52] U.S. Cl. ............... 427/577; 427/249; 427/255.7; 427/573; 427/575; 204/192.22
[58] Field of Search ............... 427/38, 39, 249, 427/402, 122, 577, 573, 575, 255.7; 423/446; 204/192.16, 192.22, 192.26; 428/408

[56] References Cited

U.S. PATENT DOCUMENTS

| | | | |
|---|---|---|---|
| 3,030,188 | 4/1962 | Eversole | 23/209.4 |
| 4,434,188 | 2/1984 | Kamo et al. | 427/39 |
| 4,707,384 | 11/1987 | Schachner et al. | 427/249 |
| 4,724,169 | 2/1988 | Keem et al. | 427/249 |
| 4,816,286 | 3/1989 | Hirose | 427/255.1 |
| 4,961,958 | 10/1990 | Desphandey et al. | 427/38 |
| 4,985,227 | 1/1991 | Ito et al. | 423/446 |
| 4,988,421 | 1/1991 | Drawl et al. | 204/192.3 |
| 5,023,068 | 6/1991 | Jones . | |

FOREIGN PATENT DOCUMENTS

| | | |
|---|---|---|
| 02104664 | 4/1990 | Japan . |
| 2-107596 | 4/1990 | Japan . |
| 2-117096 | 5/1990 | Japan . |
| 2-133397 | 5/1990 | Japan . |
| 2-259058 | 10/1990 | Japan . |
| 2-267284 | 11/1990 | Japan . |
| 2-296378 | 12/1990 | Japan . |
| 3-30135 | 2/1991 | Japan . |

OTHER PUBLICATIONS

Vitkavage et al, "Plasma Enhanced Chemical Vapor Deposition of Poly-Crystalline Diamond and Diamondlike Films", J. Vac. Sci. Tech. A 6(3) May/Jun. 1988 pp. 1812–1815.
M. Pinneo, "CVD Diamond: Improving on Nature", *Lasers & Optronics;* Aug. 1990, pp. 49–53.
K. Spear, "Growth of Crystalline Diamond from Low-Pressure Gases", *Earth and Mineral Sciences;* Pennsylvania State University; vol. 56, No. 4, Summer 1987 pp. 53–59.

*Primary Examiner*—Roy V. King
*Attorney, Agent, or Firm*—Stephen J. Church; Melvin J. Sliwka

[57] ABSTRACT

An adhering, continuous diamond film of optical or semiconductor quality is deposited on a substrate by forming on the substrate a layer of a nitride and then depositing diamond on the nitride without mechanical treatment or seeding of the substrate or the nitride. A substrate of silicon or silicon carbide has been used by depositing a layer of silicon dioxide directly on the substrate and then directly depositing the nitride layer on the silicon dioxide. A polycrystalline diamond film has been deposited by heating the substrate and nitride layer in a vacuum chamber containing a microwave activated mixture of hydrogen and a gas including carbon with the nitride being a refractory nitride to withstand the temperature at which the diamond is deposited. Deposition of the diamond is facilitated by adding oxygen to the mixture after a sufficient thickness of diamond is deposited to protect the nitride layer from oxidation.

2 Claims, 2 Drawing Sheets

5,800,879

DEPOSITION OF HIGH QUALITY DIAMOND FILM ON REFRACTORY NITRIDE

BACKGROUND OF THE INVENTION

1. Field of the Invention

The present invention pertains to coating processes using vapor deposition of plural coatings including diamond, nitrides, and oxides.

2. Description of the Prior Art

The carbon allotrope diamond has many potential uses. Diamond has extreme hardness, resistance to thermal and mechanical shock, and transparency to a wide range of electromagnetic wavelengths from ultraviolet through visible and infrared radiation to microwaves. Diamond would thus be an unexcelled coating for transmitting, reflecting, and absorbing optical and microwave elements subjected to weather and high energy radiation. Diamond also has high thermal conductivity and high electrical resistivity when pure. Diamond would thus make integrated circuits and other electrical and electronic devices incorporating a diamond film unexcelled for operation at high temperature, for convenience of cooling, and where transparency, environmental resistance, and radiation resistance are desirable.

The chemical vapor deposition (CVD) of a film of polycrystalline diamond from an activated gaseous mixture which includes a gas containing carbon is well-known and would appear to make these potential uses practical. However, diamond films deposited heretofore by CVD on a non-diamond substrate do not adhere thereto sufficiently for practical purposes unless the substrate is first abraded, as with diamond grit, or seeded with diamond particles, as by such abrasion leaving diamond particles. As a result of such abrasion and/or seed particles, the substrate is irregular and the crystallites forming the deposited film are irregular in size and spacing, very defected, and without preferred crystal orientation. The substrate and diamond film of the prior art are thus too irregular for use as an optical coating although continuous and smooth polycrystalline films are well-suited as optical coatings. Although prior art CVD diamond may be usable as a relatively massive heat sink, prior art CVD diamond is too irregular for use in an electronic device for use as an electrical insulating or thermal conducting layer within an integrated circuit.

The deposition, in a chamber containing gas at a pressure less than atmospheric, of a film or layer of a material onto a substrate is, of course, well-known. Such vacuum deposition may be carried out by sputtering where ions of a gas, typically argon heated by microwave energy, eject atoms to be deposited from a target of the material so that the freed atoms travel to an adjacent substrate and are deposited thereon. Movement of such freed atoms to the substrate may be motivated by a suitable electric potential between the target and substrate. An oxide or nitride of the target material may be deposited by including, respectively, oxygen or nitrogen in the gas in the chamber. Suitable materials, structures, temperatures, and pressures for sputtering deposition of oxides and nitrides of a variety of elements on a variety of substrate materials are readily available for selection by one skilled in the art of vacuum deposition.

In chemical vapor deposition, atoms to be deposited on a substrate are provided as atoms in molecules of a gas present in the chamber and activated while in contact with the substrate. Typically, the gas is activated by heating the gas by microwave energy, a hot filament, electric discharge, or combustion so that the gas releases free radicals containing the atoms to be deposited on the substrate. Typically in CVD, no electric potential relative to the substrate is provided, and the substrate is maintained at a suitable temperature by electrical resistance or induction heating.

In deposition of diamond by CVD, a gas containing the carbon which forms the diamond is provided as small proportion of a gaseous mixture in the chamber, the balance of the gas being predominately hydrogen. Such a mixture may be activated by microwave energy at a frequency which excites the hydrogen molecule. The carbon containing gas is usually methane which is readily obtained in a pure state and is present in the mixture at a proportion less than 5% and, typically, 0.5% to 2%. However, the necessary carbon-containing free radicals may be obtained from vapors of other hydrocarbons, alcohols, or the like. It is known in diamond CVD to add a small amount of oxygen to the mixture of hydrogen and carbon containing gas, the proportion of oxygen being substantially less than that of methane. The oxygen serves to increase the rate and quality of diamond deposition by oxidizing graphite which, depending on the deposition conditions, may be deposited along with the diamond.

Diamond may be deposited by CVD over a wide range of conditions. The vacuum chamber may be maintained at a pressure of 0.1 to 100 Torr by pumping while providing new gaseous mixture. The substrate is maintained at 550° to 1100° C. In general higher pressures increase the rate of diamond deposition as do higher substrate temperatures up to 900° or 1000° C. In prior art diamond CVD, variations in substrate temperature, in gas activation method and temperature, in the proportion of carbon providing gas, and in the method of substrate abrasion provide some control over the crystal size and the irregularity of the deposited diamond. However, in all prior art diamond CVD the deposited polycrystalline diamond is, as before stated, irregular and highly defected.

The irregularities of prior art CVD diamond films may be disadvantageous for mechanical protection even where optical and electrical properties are irrelevant. For example, a very thick diamond layer may be rapidly deposited using a plasma torch or jet in which the carbon containing gas, which may be a portion of a flame, is activated by discharging the gas through an electric arc. However, the resulting diamond layer is so irregular and the crystallites so imperfectly joined that the layer has, despite its thickness, relatively poor resistance to weathering.

Chemical vapor deposition of diamond from an activated gaseous mixture, which includes a gas containing carbon, onto bulk hot pressed silicon nitride or onto bulk hot pressed boron nitride has been attempted. However, insofar as known to the applicants, such deposition was not successful unless the bulk hot pressed nitride material was first seeded by abrasion with diamond grit as described above; and, even when so seeded, the resulting diamond did not form a continuous film. It is believed that this failure to deposit diamond or form a diamond film was because such hot pressed materials, which are imperfectly compacted from powdered nitrides, have interstices, conflicting crystal orientations, and other irregularities which inhibit nucleation and formation of a continuous film.

Because of its infrared transmissivity, zinc sulfide is preferred for transmissive optical elements. However, zinc sulfide is relatively soft and brittle and sublimes at about 800° C. and thus has poor environmental resistance including poor resistance to thermal heating by air flow due to supersonic vehicle movement. Although silicon and other relatively hard and refractory substances are used as optical

3 elements, these substances are relatively brittle and thus easily damaged by thermal and mechanical shock as from rain drop impact due to high vehicle speeds. An optical quality diamond film would provide environmental resistance for zinc sulfide and other optical materials; but, as before stated, such a film cannot be provided by prior art CVD processes.

SUMMARY AND OBJECTS OF THE INVENTION

An adhering, continuous diamond film of optical or semiconductor quality is formed on a substrate by depositing an interlayer of a nitride on the substrate and then depositing diamond directly onto the interlayer by chemical vapor deposition without mechanically treating or seeding the substrate or the interlayer. When the substrate is silicon or silicon carbide, a layer of silicon dioxide may be deposited on the substrate and the interlayer directly deposited on the silicon dioxide. The diamond film has been deposited as a layer of polycrystalline diamond on the nitride interlayer from a gaseous mixture of hydrogen and a gas, such as methane, containing carbon, the substrate and the interlayer being heated and the gaseous mixture being activated by microwave energy. The nitride is a refractory nitride, for example aluminum nitride or silicon nitride, so as to withstand the substrate temperature at which the diamond is deposited. Such a diamond film may be depositable on a zinc sulfide substrate if the substrate temperature is in a range of about 600° to about 800° C. Deposition of the diamond is facilitated by the addition of oxygen to the gaseous mixture, the oxygen being added after diamond is deposited to a sufficient thickness of to protect the nitride interlayer from oxidation.

It is therefore an object of the present invention to provide a diamond film of sufficiently high quality for optical and semiconductor uses.

Another object is to provide such a high quality diamond film which adheres well to a substrate.

Another object is to provide such a diamond film without abrading or otherwise mechanically treating or seeding a substrate or any interlayer.

Another object is to provide such a high quality diamond film which is highly resistive to environmental effects.

Still another object is to provide a diamond film for optical materials which are relatively soft, brittle, or nonrefractory.

A further object is to provide a diamond film which is fully effective in satisfying the above and other objects and yet is convenient and economical to apply to a variety of substrate materials.

BRIEF DESCRIPTION OF THE DRAWINGS

Other objects, advantages, and novel features of the subject invention will become apparent from the following detailed description when considered with the accompanying drawings in which.

DETAILED DESCRIPTION

Figure 1:
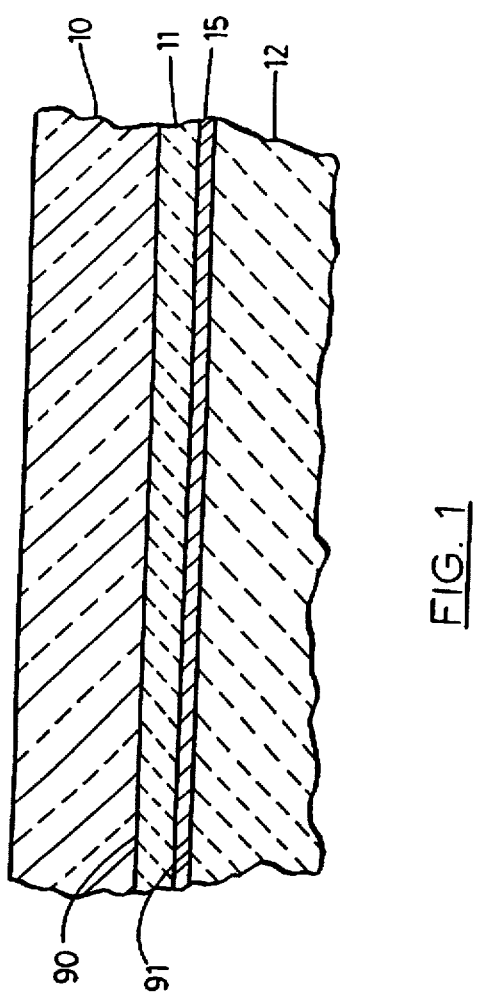
FIG. 1 is a diagram representing a polycrystalline diamond film deposited in accordance with the method of the present invention on a refractory nitride interlayer, the diamond film and refractory interlayer being depicted with another interlayer and a substrate.

FIG. 1 is a fragmentary representation of a layered structure, such as an optical element, constructed in accordance with a method of the present invention for deposition of a high quality, continuous, polycrystalline diamond film 10 directly on a refractory nitride interlayer 11 which is, in turn, deposited on a substrate 12.

The layered structure also includes an adhesion interlayer 15 which is not in itself a part of the subject invention and which is deposited directly on the substrate 12, the nitride interlayer 11 being deposited directly on the adhesion interlayer. As subsequently explained, when the nitride interlayer and substrate are formed of certain materials and when certain methods of deposition are used to deposit the interlayer, an adhesion interlayer, such as layer 13, is not required and the nitride interlayer is deposited directly on the substrate. Also, it is believed that bulk nitride material having the necessary refractory and diamond film nucleation properties may be substituted for interlayer 11, no substrate 12 then being required.

The interlayers 11 and 15 may be deposited by any suitable methods which are not in themselves a part of the subject invention. Any suitable material may be used for the substrate 12 and for the adhesion interlayer 15 and these materials also are not in themselves a part of the subject invention. However, several such deposition methods and substrate and adhesion materials which have been found most effective in the practice of the present invention are disclosed in the description and examples below.

It will be subsequently apparent that the relative thicknesses shown for layers 10, interlayers 11 and 15, and substrate 12 are not to scale, but are selected for illustrative convenience. Further, it will be apparent to one skilled in the art that in an article of manufacture having a diamond layer, such as layer 12, deposited in accordance with a method embodying the present invention, the diamond layer may itself have subsequently deposited thereon an additional layer or coating; that a substrate, such as substrate 12, may itself be deposited on a base substrate; and that, after deposition of the diamond layer, any or all of the interlayers and substrate may be removed, as by etching, leaving the diamond layer and any unremoved interlayer.

Figure 2:
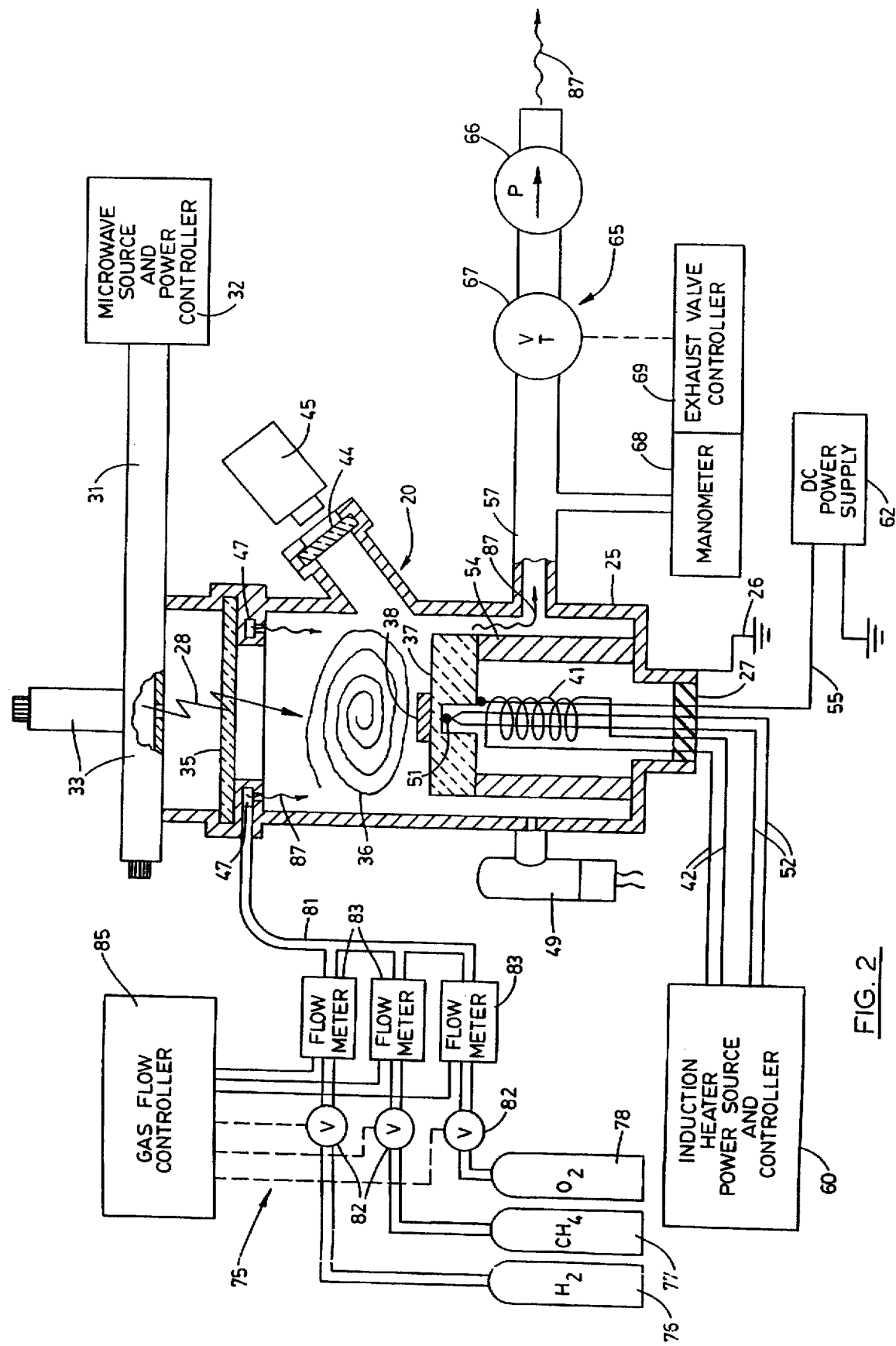
FIG. 2 is a diagram of a representative vacuum chamber and associated apparatus for depositing such a diamond film on a refractory nitride interlayer in accordance with the present invention.

A representative vacuum chamber 20 and associated apparatus as used in the practice of methods embodying the present invention are shown in FIG. 2. The chamber and other apparatus, which are all well-known in the art of chemical vapor deposition (CVD) and which are, therefore, schematically represented, will be briefly described at this point before describing in detail methods embodying the present invention.

Chamber 20 has a cylindrical side wall 25 and opposite upper and lower walls. These walls are, typically, constructed of stainless steel and are connected to a system ground 26. The lower wall has a vacuum feedthrough indicated by numeral 27, and the upper wall has a slot for admission of microwave energy indicated by numeral 28. This energy is, typically, at 2.45 GHz for resonance with hydrogen molecules and is provided through a waveguide 31 from a microwave source and power controller 32 which provides a selected level of microwave energy to the waveguide. Since reflected microwave energy from the chamber may be minimized by adjustment of tuning stubs 33, this level is substantially that provided to the chamber. A quartz window 35 isolates the chamber interior physically from the microwave supplying elements, but passes microwave energy to form a plasma ball 36 of activated gas within the chamber and above an electrically and thermally conductive graphite stage 37. This stage mounts an item 38 consisting of substrate 12 and nitride interlayer 11 for deposition of diamond film 10 from the activated gas. The substrate portion opposite the interlayer is engaged with the stage for heating therewith by an induction heating coil 41 extending from the stage oppositely of the item and energized through leads 42 extending through feedthrough 27. The portion of item 38 opposite stage 37 is heated primarily by thermal conduction from the stage, and the surface of this portion contacted by the plasma ball and undergoing diamond deposition therefrom is viewable through a window 44 in wall 25 by an optical pyrometer 45 for determining the exact temperature of such surface. Chamber 20 has a ring manifold 47 disposed adjacent to quartz window 35 for distributing gas to the chamber interior and has a connection through wall 25 to an ionization gage 49 for precise measurement of the vacuum within the chamber. A thermocouple 51 engages stage 37 oppositely of, but adjacent to, item 38, and leads 52 extend from the thermocouple through feedthrough 27. Stage 37 is mounted on an alumina cylinder 54 disposed concentrically with wall 25 and about coil 41. Cylinder 54 insulates stage 37 electrically and thermally from the chamber walls, and a lead 55 provides electrical connection through feedthrough 47 to stage 37. Chamber 20 has an exhaust conduit 57 through wall 25.

The apparatus associated with chamber 20 includes an induction heater power source and controller device 60 connected to thermocouple leads 52 to sense the temperature of stage 37, which corresponds to the temperature of the item 38 surface exposed to plasma ball 36. Device 60 is connected to leads 42 to energize coil 41 so as to maintain the stage at a selected temperature measured by thermocouple 51 and corresponding to a desired temperature of such surface as measured by pyrometer 45. A DC power supply 62 is connected between lead 55 and ground and is adapted to maintain a selected DC bias voltage in a range of about positive 20 volts to about negative 80 volts between wall 25, within which is plasma ball 36, and stage 37 so that this bias voltage is substantially that between such surface of item 38 and wall 25.

The associated apparatus also includes an exhaust system, which is indicated generally by numeral 65, for maintaining a selected pressure in the range of about 20–50 torr in chamber 20 while feed gas is being provided to the chamber. System 65 has a vacuum pump 66 connected to conduit 57 for continuously withdrawing a flow of gas from the chamber and has an exhaust valve 67 for selectively throttling this flow. A precision manometer 68 is connected to conduit 57 for measuring the vacuum in chamber 20, and the manometer is connected to a controller 69 for exhaust valve 66. Controller 69 is adapted to actuate valve 67 in accordance with signals from manometer 68 so as to maintain a selected such vacuum which may be monitored by ionization gage 49.

The associated apparatus further includes a gas supply system 75 connected between ring manifold 47 and bottles 76–78 which contain, respectively and for the purposes of the present invention, hydrogen, methane, and oxygen. System 75 is adapted to provide to chamber 20 a selected flow of any gas or of any predetermined mixture of gases from the bottles. Each bottle is connected to a supply manifold 81, which communicates with ring manifold 47, through a control valve 82 and a flow meter 83. A gas flow controller 85 receives signals from meters 83 and provides signals to valves 82 so as to maintain the selected gas flows from each bottle 76–78.

When chamber 20 and the associated apparatus are in operation and as indicated by arrows 87, the selected gas or gas mixture enters the chamber at a selected flow rate and participates in the plasma ball 36 while gases resulting therefrom and any other gases are continuously withdrawn by the exhaust system at a rate determined by valve 67. A selected pressure is thus maintained in the chamber for CVD deposition or other action related to the deposition of a diamond layer such as layer 10.

The subject invention involves the discovery by the applicants that, without either mechanical treatment, such as abrasion with diamond grit, or seeding with diamond particles, a continuous, adhering, polycrystalline diamond film 10 is depositable on a substrate 12 by CVD from an activated gaseous mixture including hydrogen and a gas providing the carbon for formation of diamond crystallites making up the film. Since such treatment or seeding are not required with the present invention, the smoothness, crystallite regularity, and continuity of the deposited film are not adversely affected by physical irregularities introduced in prior art CVD diamond deposition requiring such treatment and seeding. As a result, a diamond film deposited by CVD in accordance with the present invention is of high quality and suited for protective coatings or other uses in optical elements and for layers or elements of an integrated circuit or other semiconductor device.

In the present invention as represented in FIG. 1, a nitride interlayer 11 is deposited on the substrate 12 and the diamond film is deposited directly on a nitride interlayer surface 90 opposite the substrate. The nitride interlayer may be deposited directly on the substrate or may be deposited on an adhesion layer, such as layer 15, which is directly deposited on the substrate. In the present invention, the substrate surface 91 on which such an adhesion layer or such a nitride interlayer is deposited is smooth and neither surface 90 nor 91, or the adhesion layer are abraded with diamond grit or otherwise mechanically abraded or treated or seeded with diamond or other material before depositing the diamond film. As a result, the interlayer surface is also smooth.

The thermodynamic conditions for CVD deposition of diamond instead of graphite, where the diamond is deposited at a useful rate and with useful purity, are the same for the subject invention as in the above discussed prior art deposition of diamond by CVD from a gaseous mixture of hydrogen and a gas, such as methane, containing carbon which forms the diamond. These conditions require that the surface on which such deposition occurs, such as surface 90, have a temperature in the range of about 600° to about 1100° C. since lower temperatures result in substantially no deposition and higher temperatures result in the deposition of graphite only. The above-described conditions for CVD diamond deposition in the prior art, such as pressures in a range of 0.1 to 100 torr, microwave activation of a mixture of hydrogen with less than 5% methane, and the use of oxygen in the mixture also apply to CVD diamond deposition in accordance with the present invention. As a result, it is believed that, as in the prior art and in addition to the type of apparatus shown in FIG. 2 and the conditions set forth in the following examples, the present invention may be also be practiced using carbon sources other than methane and may be practiced with any suitable apparatus, amount of microwave power for activation, or other source of activation energy.

It is apparent that a nitride used to form interlayer 11 must resist the deposition temperatures set forth above of at least about 600° C.; that is, the nitride must be refractory or resistant to heat. The present invention has been effectively practiced with the refractory nitrides aluminum nitride and silicon nitride; and it is believed that other refractory nitrides, for example but not limited to, boron nitride, hafnium nitride, zirconium nitride, tantalum nitride, niobium nitride, vanadium nitride, and titanium nitride, may be equally effective for the practice of the present invention.

In the practice of the present invention, an interlayer 11 of a refractory nitride deposited by sputtering has been found highly effective. Such an interlayer has been formed of silicon nitride or aluminum nitride deposited by the well-known RF diode sputtering process on a substrate 12 of silicon or silicon carbide, an adhesion layer 15 of silicon dioxide being formed directly on the substrate in the same RF diode process before deposition of the nitride. The adhesion layer need only have a thickness of about 50 to 100 angstrom units. The present invention has also been practiced effectively with an interlayer 11 of aluminum nitride deposited directly on a substrate 12 of single crystal silicon by DC magnetron sputtering, no adhesion layer, such as layer 15, being provided between the silicon substrate and the aluminum nitride.

It is, of course, necessary in the practice of the subject invention that the refractory nitride, such as that of interlayer 11, be sufficiently thick and regular to allow substantial and regular diamond nucleation. If the nitride interlayer is too thin, it may be so damaged by the highly erosive activated hydrogen of the plasma ball 36 that such nucleation does not occur. In the practice of the present invention, a thickness for interlayer 11 of at least 500 angstrom units has been satisfactory. This thickness allows the surface 90 to be effectively cleaned by exposure to a plasma ball 36 of substantially pure hydrogen for a few minutes prior to introduction of methane to commence diamond deposition.

In the practice of the subject invention, it has been found that the above-described use of oxygen in the gaseous mixture, which is provided by system 75 for plasma ball 36, when the methane is initially introduced may result in such oxidation of the nitride interlayer 11 that no diamond film 10 is deposited thereon. However, a feature of the present invention involves the gaseous mixture being substantially free from oxygen at the beginning of diamond deposition so that the nitride interlayer is not oxidized, and then, after a sufficient thickness of diamond layer 10 has been deposited to protect the nitride, introducing oxygen into the mixture to promote faster growth and purity of the diamond subsequently deposited.

It has been found advantageous while depositing a diamond film, such as film 10 in a chamber such as chamber 20 by CVD, to provide, as by DC power supply 62, a bias voltage between the substrate 12 and the walls, such as wall 25 within which is the gas for and in the plasma ball 36. Under typical conditions for effective diamond film deposition set forth in the following examples, giving the substrate a positive bias of about 20 volts positive in relation to the wall has been found to promote more rapid growth of smaller and more regular crystallites.

The subject invention is, typically, carried out using a refractory nitride interlayer 11 about 2500 angstrom units in thickness; however, it is believed by the applicants that such a layer of refractory nitride material of any practical thickness may be coated with a diamond film 10 in accordance with the subject invention.

The principles of the subject invention may thus be employed for deposition of a protective or other diamond coating on zinc sulfide, which as before stated sublimes at about 800° C., by sputtering a nitride interlayer 11 on a substrate 12 of zinc sulfide under well-known conditions which avoid damage to the zinc sulfide substrate, and then and in accordance with the present invention, depositing a diamond layer 10 on the interlayer using temperatures in the range of about 600° to about 800° C. which will not result in damage to the zinc sulfide substrate.

Under CVD conditions which have been found effective for deposition of a continuous diamond film on refractory nitride material in accordance with the present invention, the applicants have attempted to deposit a diamond film directly on a silicon dioxide adhesion layer, on a silicon substrate, and on silicon carbide films deposited by both RF diode sputtering and by DC magnetron sputtering; but a continuous diamond film failed to form. It is believed evident that these failures to form a continuous diamond film were due to the absence of a nitride layer on the silicon dioxide, silicon, or silicon carbide.

The applicants have also attempted to deposit diamond film by CVD on hot pressed bulk silicon nitride and boron nitride and on aluminum nitride deposited by ion beam sputtering, but a continuous diamond film failed to form. In the hot pressed bulk nitride materials, it is believed that this failure was due to the relatively low density, interstices, and crystal irregularities of these nitride materials. In the IBS deposited aluminum nitride, it is believed that a diamond film failed to form for two reasons. First, the relatively higher stresses present in IBS deposited aluminum nitride relative to DC magnetron sputtered aluminum nitride led to adhesion failure of the IBS deposited material when it was elevated to the substrate temperatures for diamond film deposition. And second, the structure of the IBS deposited aluminum nitride is more dense and less columnar than the structure of the DC magnetron deposited material in which the more columnar structure is believed to promote nucleation of the diamond film.

Therefore, it is believed apparent that the subject invention in its broadest aspect involves the deposition of diamond by CVD on any nitride material sufficiently refractory to withstand the temperature at which deposition occurs and sufficiently uniform for widespread nucleation of diamond crystallites.

EXAMPLES

In the following examples and prior to chemical vapor deposition (CVD) of diamond in accordance with the subject invention, substrate and interlayers were provided by well-known techniques as follows:

silicon was provided as 99.999% purity targets for sputtering and as single crystal wafers for the substrate;

silicon dioxide adhesion layers were deposited by RF diode sputtering from a silicon target in an argon and oxygen mixture to a thickness in the range of 50–100 angstrom units;

silicon nitride was deposited by RF diode sputtering from a silicon target in an argon and nitrogen mixture to a thickness of either 500 or 2500 angstrom units;

aluminum nitride was deposited by DC magnetron sputtering in pure nitrogen from a 99.995% purity aluminum target to a thickness of 2500 angstrom units;

aluminum nitride was also deposited by ion beam sputtering in pure nitrogen from a 99.995% purity aluminum target to a thickness of 2500 angstrom units; and silicon carbide was deposited to a thickness of 2500 angstrom units by ion beam sputtering from a beta-silicon carbide target in pure argon to a thickness of 2500 angstrom units.

In the following examples, deposition of diamond by CVD in accordance with the subject invention was carried out in a 1.5 kw microwave reactor system including a vacuum chamber, microwave generator, and induction substrate heating. This system, a high pressure microwave system of well-known construction made by Applied Science and Technology Inc. of Cambridge, Mass., corresponds to that schematically represented in FIG. 2. An electrical bias was provided for the substrate by a conventional DC power supply. The vacuum pumping system was capable of providing a vacuum of $10^{-4}$ torr and the vacuum was monitored and controlled by a capacitance manometer. The manometer was calibrated by an ionization gauge. Hydrogen, methane, and oxygen were provided to the reactor system by a computer controlled and mass flow monitored system. The substrate temperature was monitored and controlled by a thermocouple received in a graphite stage mounting. The exact substrate temperature was determined by an optical pyrometer viewing the substrate through a window of the chamber.

The substrate bias was the direct current voltage of the substrate relative to the chamber wall.

Neither the substrate, silicon dioxide adhesion layer if used, or nitride layer were abraded with diamond or other grit or seeded with diamond.

The deposited diamond was examined for film uniformity, crystallite size, and crystal orientation by a scanning electron microscope (SEM).

EXAMPLE I

A substrate coated by RF diode sputtering with a silicon dioxide adhesion layer and then with a 2500 angstrom silicon nitride layer was utilized. The substrate was brought to 850° C. and the chamber vacuum pumped for 20 minutes. Hydrogen flow was then started, the chamber pressure set to 25 torr, and microwave power turned on to initiate the plasma ball. The hydrogen flow was then set to 176.8 sccm, the chamber pressure was set to 45 torr, the microwave input power adjusted to 900 watts, and the microwave tuning stubs adjusted to minimize reflected microwave power. For cleaning, the silicon nitride layer was then etched for 5 minutes in the hydrogen plasma. The substrate bias was turned on and set to a positive 20 volts. Methane flow was then started and set to 4.2 sccm and the deposition continued for 2 hours. Oxygen flow was then started and set to 0.85 sccm, and the deposition continued for 8 hours.

The deposited diamond was examined and found to be a continuous film about 5 micrometers in thickness. The film growth rate was thus about 0.5 micrometers per hour. The film was formed of crystallites averaging 0.5 to 1.0 micron in diameter and generally ordered in the <111>and <100>planes.

EXAMPLE II

Example II was carried out substantially as was Example I except that the layer of silicon nitride was about 500 angstrom units in thickness instead of about 2500 angstrom units. The deposited diamond film had substantially the same characteristics as that deposited in example I.

EXAMPLE III

Example III was carried out substantially as was Example I except that a layer of DC magnetron deposited aluminum nitride was used instead of the Example I layer of silicon nitride. The deposited diamond film had substantially the same characteristics as that deposited in Example I.

EXAMPLE IV

Example IV was carried out substantially as was Example I except that the substrate was bulk beta-silicon carbide and the silicon oxide adhesion layer was then deposited on the silicon carbide. A silicon nitride layer of 2500 angstrom units thickness was deposited on the adhesion layer as in Example I. The deposited diamond film had substantially the same characteristics as that deposited in Example I.

EXAMPLE V

Example V was carried out substantially as was Example I except that a single crystal silicon substrate was used, no silicon oxide adhesion layer was used, and the nitride layer was aluminum nitride of about 2500 angstrom units in thickness deposited by DC magnetron sputtering. The deposited diamond film had substantially the same characteristics as that deposited in example I.

EXAMPLE VI

Example VI was carried out substantially as in Example I except that the substrate bias was substantially zero instead of a positive 20 volts.

In the resulting film, the diamond crystallite size was 2–5 microns instead of 0.5–1 micron; however the resulting film thickness in 10 hours was 2.5 micrometers, a film growth rate of 0.25 micrometers per hour, and the crystal structure was highly disordered.

EXAMPLE VII

Example VI was carried out substantially as in Example I except that the substrate bias was substantially a negative 20 volts instead of a positive 20 volts.

In the resulting film, the diamond crystallite size was 5–20 microns instead of 0.5–1 micron. The film growth was at a rate of 0.5 to 1.0 micrometers per hour.

EXAMPLE VIII

Example VI was carried out substantially as in Example I except that the substrate bias was substantially a negative 80 volts.

No continuous diamond film formed, although sparse and very large crystallites, 10–30 microns in diameter, developed randomly over the silicon nitride interlayer.

This failure to form a diamond film was evidently due to the relatively much more negative substrate bias than that provided in Examples I, VI, and VII.

EXAMPLE IX

Example IX was carried out substantially as in Example I except that deposition of a diamond film was attempted directly on a silicon oxide adhesion layer deposited by RF diode sputtering, no nitride layer being deposited on the adhesion layer.

No continuous diamond film was formed.

This failure to form a diamond film was evidently due to the absence of a refractory nitride layer on the silicon oxide layer.

EXAMPLE X

Example X was carried out substantially as in Example I except that deposition of a diamond film was attempted directly on a silicon substrate having no adhesion layer or nitride layer deposited thereon.

No continuous diamond film was formed.

This failure to form a diamond film was evidently due to the absence of a refractory nitride layer on the silicon.

EXAMPLE XI

Example XI was carried out substantially as in Example I except that deposition of a diamond film was attempted directly on a silicon carbide film deposited by ion beam sputtering (IBS).

No continuous diamond film was formed.

This failure to form a diamond film was evidently due to the absence of a refractory nitride layer on the silicon carbide.

EXAMPLE XII

Example XII was carried out substantially as in Example I except that deposition of a diamond film was attempted directly on a silicon carbide film deposited by ion beam sputtering (IBS).

No continuous diamond film was formed although sparse crystallites grew at pinholes in and edges of the silicon carbide film.

This failure to form a diamond film was evidently due to the absence of a refractory nitride layer on the silicon carbide.

EXAMPLE XIII

Example XIII was carried out substantially as in Example I except that deposition of a diamond film was attempted on an aluminum nitride layer deposited by ion beam sputtering (IBS) instead of by DC magnetron sputtering.

No continuous diamond film was formed although sparse crystallites grew at pinholes in and edges of the aluminum nitride layer.

It is believed that this failure to form a diamond film was due to the above-described inferior adhesion, greater density, and less columnar structure of IBS deposited aluminum nitride relative to DC magnetron sputtered aluminum nitride.

EXAMPLE XIV

Example XIV was carried out substantially as in Example I except that the deposition of diamond film was attempted directly on bulk silicon nitride formed by hot pressing from silicon nitride powder.

No continuous diamond film was formed.

It is believed that this failure to form a diamond film was due to the interstices, conflicting crystal orientations, other irregularities and lower density characteristic of such hot pressed bulk material in contrast to the more regular structure and greater density of silicon nitride deposited by RF diode sputtering.

EXAMPLE XV

Example XV was carried out substantially as was Example I except that the deposition of diamond film was attempted directly on bulk boron nitride formed by hot pressing from boron nitride powder.

No continuous diamond film was formed.

It is believed that this failure to form a diamond film was due to the interstices, conflicting crystal orientations, other irregularities and lower density characteristic of such hot pressed bulk material in contrast to the more regular structure and greater density of aluminum nitride, silicon nitride, or other refractory nitride as deposited by RF diode sputtering or by DC magnetron sputtering.

When these examples and the foregoing description are considered, it is evident that many modifications and variations are possible in light of the above teachings. It is, therefore, to be understood that within the scope of the appended claims the invention may be practiced other than as specifically set forth in the above description and examples.

What is claimed is:

1. A method of forming a continuous layer of polycrystalline diamond on a substrate, the method comprising;

depositing a refractory nitride on the substrate; and depositing said layer directly on said nitride from activated gas containing carbon, said nitride not being abraded with diamond before depositing said layer, wherein said gas containing carbon is included in a mixture of gases and wherein:

said mixture of gases is substantially free from oxygen at the beginning of said depositing of said layer; and during said depositing of said layer, oxygen is added to said mixture after said layer has a thickness sufficient to protect said nitride from oxidation by said oxygen.

2. A method of forming a continuous layer of polycrystalline diamond on a substrate, the method comprising depositing a refractory nitride on the substrate; and depositing said layer directly on said nitride from activated gas containing carbon, said nitride not being abraded with diamond before depositing said layer, wherein said substrate is zinc sulfide and during said depositing of said layer said substrate and said nitride are at a temperature greater than 600 degrees centigrade and less than a temperature resulting in damage to said substrate.

* * * * *